United States Patent [19]

Fang et al.

[11] Patent Number: 4,648,991

[45] Date of Patent: Mar. 10, 1987

[54] PYROELECTRIC CRYSTALS WITH HIGH FIGURES OF MERIT

[75] Inventors: Chang-Shui Fang, Shan Dong; Yao Xi, Shaan-xi; Zhi-Xiong Chen, Wuhan, all of China; Amar S. Bhalla; Leslie E. Cross, both of State College, Pa.

[73] Assignee: Research Corporation, Tucson, Ariz.

[21] Appl. No.: 615,203

[22] Filed: May 30, 1984

[51] Int. Cl.$^4$ .......................... H01J 31/26; C09K 3/00; H01L 35/12

[52] U.S. Cl. ......................................... 252/1; 313/388; 310/306; 136/213; 136/236.1

[58] Field of Search .................. 310/306; 252/1, 408.1, 252/950; 562/554, 575; 313/14, 388; 23/301; 136/213, 236.1, 237, 238, 239

[56] References Cited

U.S. PATENT DOCUMENTS

| | | | |
|---|---|---|---|
| 3,352,906 | 2/1963 | Perkerson et al. | 562/554 |
| 3,641,346 | 2/1972 | Lachambre | 136/213 X |
| 3,839,640 | 10/1974 | Rossin | 136/213 X |
| 3,946,612 | 3/1976 | Sagi | 374/161 OR |
| 3,953,503 | 4/1976 | Furuhata et al. | 562/544 |
| 3,999,698 | 12/1976 | Conklin | 228/122 |
| 4,018,638 | 4/1977 | Singer et al. | 156/626 |
| 4,019,084 | 4/1977 | Conklin et al. | 313/388 |
| 4,211,821 | 7/1980 | Hadni | 428/411 |
| 4,336,452 | 6/1982 | Baker | 250/338 |
| 4,349,410 | 9/1982 | Stupp et al. | 156/654 |
| 4,491,679 | 1/1985 | Moore | 136/239 X |

OTHER PUBLICATIONS

Bhalla, et al., "Pyroelectric Properties...", App. Phys. Lett. 43(10) Nov. 15, 1983, 932-934.
Batra et al., "Dielectric and Pyroelectric...", J. Mater. Sci Lett, 2 (1983) 243-244.
Keve, "Pyroelectric Materials...", Philips Tech. Rev. 35, 247-257, 1975, No. 9. pp. 247-257.
Lock, "Doped Triglycine...", Appl. Phys. Lett. 19(10) Nov. 15, 1971, pp. 390-391.
Shaulov, "Improved Figure of Merit...", Appl. Phys. Lett 39(2) Jul. 15, 1981, pp. 180-181.
Fang, et al., "Pyroelectric Properties of a New Alanine and Phosphate-Substituted TGS Crystal", Mater Lett, V. 2(2), 10/1983 p. 134.
German, et al., "Idenfification of the Initial Stage...", J. Mater. Sci., 11 (1976) 71-77.
Pradhan, et al., "Laser Probe . . . ATGS", Indian J. Physics, 54B, 378-383 (1980).
Keve et al., "Effects of Additives...", J. de Physique, Colloque C2, Suppl. to No. 4, V. 33, Apr. 1972, C2-229.
Mathur, "Dielectric and Pyroelectric Studies of TGS, TGFB and TGS-TGFB System", Ferroelectrics, 1981, V. 39, p. 1197.
Itskovskii, et al., "Pyroelectric...", Ferroelectrics, 1980, V. 29, pp. 167-174.
Bye, et al., "High Internal Bias Fields in TGS(L-Alanine), Ferroelectrics, 1972, vol. 4, pp. 253-256.
Bye, et al., "Triglycine Sulfate/Selenate...", Ferroelectrics, 1976, vol. 11, pp. 525-534.
Fang, et al., "The Growth and Properties of a New Alanine and Phosphate...", Ferroel., 1983, V. 51, pp. 9-13.
Bye et al., "Alanine Doped TGS/TGSc...", Ferroelectrics, 1974, vol. 7, pp. 179-181.

Primary Examiner—John F. Terapane
Assistant Examiner—Catherine S. Kilby
Attorney, Agent, or Firm—Scully, Scott, Murphy & Presser

[57] ABSTRACT

Pyroelectric crystals having relatively high figures of merit (p/K) of the order of 1.8 or more are provided. They are preferably prepared by doping alanine substituted triglycine sulfate crystals with phosphorous and/or arsenic.

18 Claims, 5 Drawing Figures

PLOT OF PYROELECTRIC COEFFICIENT AND POLARIZATION OF PREFERRED ATGSAs CRYSTALS AS A FUNCTION OF TEMPERATURE

PLOT OF PYROELECTRIC COEFFICIENT, DIELECTRIC CONSTANT AND FIGURE OF MERIT OF PREFERRED ATGSAs CRYSTALS AS A FUNCTION OF TEMPERATURE.

PLOT OF TEMPERATURE AND FREQUENCY DEPENDENCE OF THE DIELECTRIC CONSTANT OF PREFERRED A T G S P CRYSTALS.

PLOT OF TEMPERATURE AND FREQUENCY DEPENDENCE OF THE LOSS TANGENT OF PREFERRED A T G S P CRYSTALS.

PLOT OF TEMPERATURE DEPENDENCE OF PYROELECTRIC COEFFICIENT AND POLARIZATION OF PREFERRED A T G S P CRYSTALS.

PYROELECTRIC CRYSTALS WITH HIGH FIGURES OF MERIT

BACKGROUND OF THE INVENTION

1. Field of the Invention

The present invention relates to pyroelectric crystals having high figures of merit (p/K) and which are useful for pyroelectric detection applications, and more particularly to alanine substituted triglycine sulfate crystals doped with phosphorous and/or arsenic.

Definitions

As such terms are used in the present invention such terms have the following meanings:

TGS=Triglycine sulfate
DTGS=Deuterated triglycine sulfate
ATGS=Alanine substituted triglycine sulfate
ATGSP=Alanine substituted triglycine sulfate doped with phosphorous
ATGSAs=Alanine substituted triglycine sulfate doped with arsenic
LTGS=Lithium doped triglycine sulfate
MTGS=Manganese doped triglycine sulfate
TGFB=Triglycine fluoroberyllate
DTGFB=Deuterated triglycine fluoroberyllate "Pyroelectric crystal" is a crystal which, if ferroelectric, when held at a temperature below its Curie temperature will experience a modification or incremental change in the polarization of such crystal when the crystal is subject to an increase or decrease in temperature and the resulting change in the polarization of the crystal is known as the "pyroelectric effect" ("First Book of Pyroelectricity", by S. B. Lang; Gordon & Breach, Science Publisher, London 1974).

"Curie temperature", in °C., means the phase transition temperature in a ferroelectric material.

The "figure of merit" of a pyroelectric crystal is the value (p/K) commonly used in the art to evaluate the usefulness of the pyroelectric effect of pyroelectric crystals in devices employed for pyroelectric applications.

The "figure of Merit" of a pyroelectric crystal equals p/K, as reported in units of $C/m^2°K.$, where p is the pyroelectric coefficient, K is the dielectric constant, C is the change in coulomb, °K. equals the temperature in degrees Kelvin and $m^2$ equals the area of the pyroelectric crystal in meters squared.

2. Description of the Prior Art

Various ferroelectric crystals such as single crystals of triglycine sulfate have been developed for use in pyroelectric applications. Relatively large TGS single crystals of very good optical quality can be grown from water solution and have found some use in pyroelectric device applications. However, the utility of these TGS crystals is somewhat limited due to the fact that they have a strong tendency to depolarize with time and/or at elevated temperatures, of about 50° C. or higher, which causes instability and deterioration of their most useful properties. Further, an apparent decrease in pyroelectric coefficient P, an increase in dielectric constant $K_{22}$ and loss tangent a at low electrical frequency below Mega Hertz result in a heavy reduction in the figure of merit therefor for pyroelectric detection applications. The resulting p/K is only about $1.1 \times 10^{-5}$ $C/m^2°K.$ (From hereon in the text, an abbreviated form of the pyroelectric figure of merit will be used, i.e., a p/K of 1.1 will be used to represent a p/K of $1.1 \times 10^{-5}$ $C/m^2°K.$ since all of the reported values are in the range of "$\times 10^{-5} C/m^2°K.$"). The TGS crystals also have a relatively low transition temperature or Curie temperature (Tc) of about 49° C. which also limits the use of these crystals for many pyroelectrical applications because the devices employing such crystals cannot be used above such temperatures since the crystals are not effective, as pyroelectric elements, at temperatures above their Tc.

Attempts to improve the properties of TGS single crystals have been made by doping the TGS crystals with various materials, ie. deuterium substitution (DTGS), alanine substitution (ATGS), lithium substitution (LTGS), manganese substitution (MTGS), and a substitution of the sulfate group with selenate (TGSe) and fluoroberyllate (DTGFB).

Other types of crystals, such as single crystals of a solid solution composition type, have also been prepared in attempts to provide single crystals of improved pyroelectric properties. In the TGS family of solid solution composition type crystals there have also been prepared, for example, TGFB:DTGFB crystals, TGSe:DTGS crystals and TGS:TGSe crystals. Although these other single crystals all provide some improvements in pyroelectric properties, such as the reduction of thermal depoling, and an increase in the Curie temperature (Tc), as compared to those of TGS single crystals, such improvements are only obtained at the expense of other useful properties and lead to the following disadvantages:

1. instability in the ambient atmospheric conditions,
2. a further lowering of the transition temperature,
3. poor mechanical properties, and
4. an inability to polish very thin samples, of about 10 to 20 μm in thickness.

The most significant property that is used for the purposes of evaluating the usefulness of a pyroelectric crystal is its figure of merit (p/K). The prior art pyroelectric crystals available to date have, at best, a figure of merit of from about 1.1 for TGS to about 1.7 for DTGFB, at 25° C., which is an optimum operating temperature for pyroelectric devices. This relatively limited range of figure of merit values thus places limitations upon the pyroelectric devices in which they are used.

Attempts have also been made to substitute and/or dope single crystal TGS with various cationic impurities as disclosed in U.S. Pat. No. 3,352,906, but the resulting crystals have the following disadvantages, as potential pyroelectric or ferroelectrical materials:

1. unfavorable changes in the dielectric constant and tangent losses (tan δ),
2. non-uniformity in the composition of the grown crystal,
3. poor reproducibility in the chemical composition of the crystal, and
4. no appreciable change in the figure of merit.

An object of the present invention is to provide for improved single crystal pyroelectrics having improved properties, and in particular, improved figures of merit.

A further object of the present invention is to provide single crystal pyroelectrics having figures of merit of >1.7, and preferably of ≧2.0.

A further object of the present invention is to provide improved single crystal pyroelectrics which have improved pyroelectric properties and which are easy and inexpensive to manufacture.

A still further object of the present invention is to provide improved single TGS based crystals which have improved figures of merit as well as higher Curie temperatures and lower dielectric constants ($K_{22}$) than single TGS crystals.

A further object of the present invention is to provide new single crystal pyroelectrics having such improved figure of merit values as to allow the new crystals to be used for pyroelectric applications for which pyroelectric single crystal TGS has not heretofore been useful, such as for operating pyroelectric devices employing such crystals above 40° C. and closer to the Tc of the crystals; and for use in certain types of infra red sensors such as vidicon, point detectors and charge coupled devices.

These, and other objects of the present invention, are achieved by doping TGS single crystals with alanine and phosphorous and/or arsenic.

BRIEF DESCRIPTION OF THE DRAWINGS

FIG. 1 of the drawings plots the pyroelectric coefficient p, as reported in units of $C/m^2K$, and the polarization factor $P_s$, as reported in units of $C/m^2$, as a function of temperature in the range of −10 to +70° C. of preferred ATGSAs crystals of the present invention, i.e., wherein about 30 to 35% of the sulfate in the ATGS crystal is substituted with As.

DESCRIPTION OF THE PREFERRED EMBODIMENT

Figure 1:
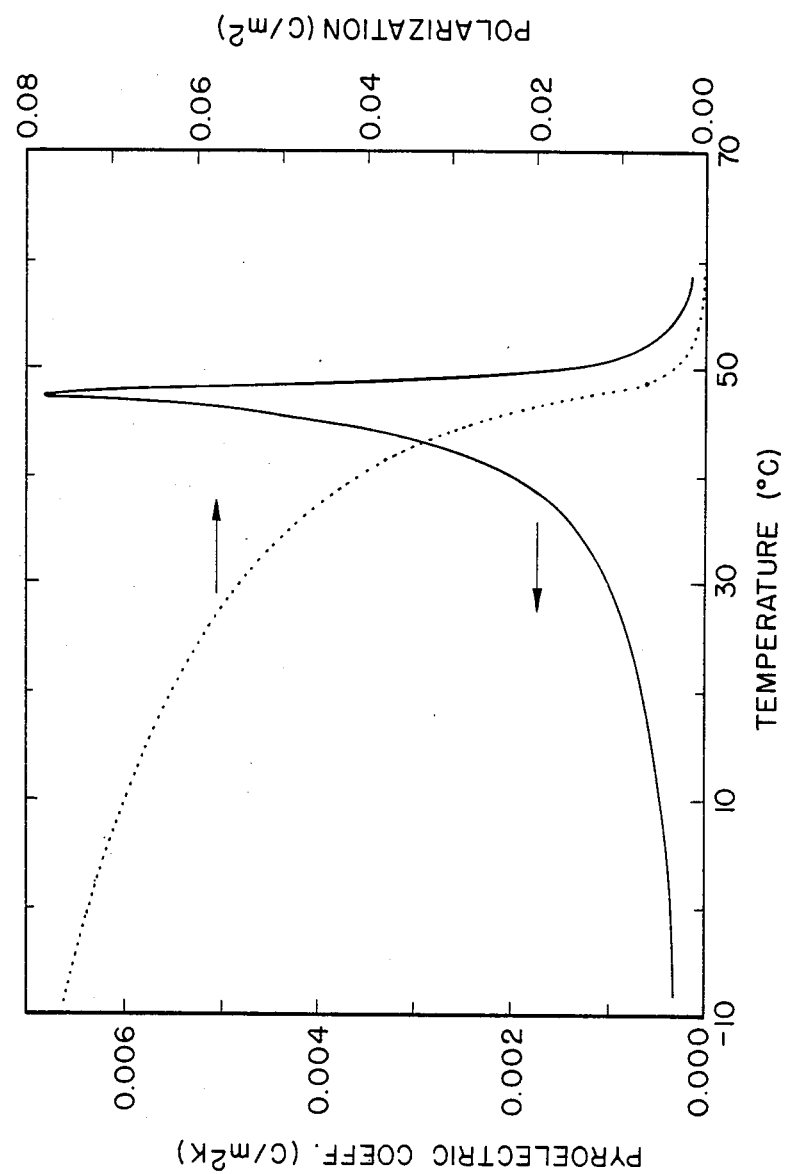

Single crystals of TGS, chemically, have the formula (glycine)$_3$.(H$_2$SO$_4$)

The alanine substituted TGS crystals (ATGS) have the structure

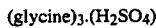
(glycine)$_{3-x}$(L-α-alanine).xH$_2$SO$_4$ wherein x is in the range of about 0.05 to 0.30, and preferably of about 0.15 to 0.20. Glycine is NH$_2$CH$_2$COOH and alanine is CH$_3$CH(NH$_2$)COOH.

The preferred single pyroelectric crystals of the present invention are ATGS crystals that have been doped with phosphorous, in the form of H$_3$PO$_4$ and arsenic in the form of H$_3$AsO$_4$.

In preparing the phosphorous doped or substituted ATGS compounds, ATGSP, the substitution proceeds according to the following reaction, on a molar basis,

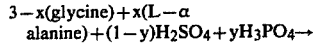
3−x(glycine)+x(L−α alanine)+(1−y)H$_2$SO$_4$+yH$_3$PO$_4$→

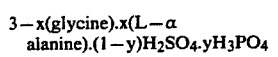
3−x(glycine).x(L−α alanine).(1−y)H$_2$SO$_4$.yH$_3$PO$_4$ wherein y is in the range of about 0.05 to 0.5, and preferably of about 0.3 to 0.4, and x is as defined above.

In preparing the arsenic doped or substituted ATGS compounds, ATGSAs, the substitution proceeds according to the following reaction, on a molar basis,

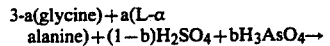
3-a(glycine)+a(L-α alanine)+(1−b)H$_2$SO$_4$+bH$_3$AsO$_4$→

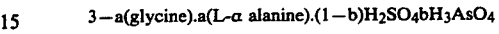
3−a(glycine).a(L-α alanine).(1−b)H$_2$SO$_4$bH$_3$AsO$_4$ wherein a is in the range of about 0.15 to 0.3 and preferably of about 0.15 to 0.20, and b is in the range of about 0.05 to 0.5 and preferably of about 0.3 to 0.35.

The synthesis of the ATGSAs and the ATGSP compounds is preferably conducted in a solution of the components thereof, in water at a pH in the range of about 2 to 2.8, and preferably of about 2.4 to 2.5, and at atmospheric pressure, and at temperatures in the range of about 35 to 40° C.

The procedures to be used in making the ATGSP and ATGSAs compounds of the present invention are analogous to those disclosed for making similar type compounds, by, for example, B. Brezina, Materials Research Bulletin, Vol. 6, Page 1401, 1971.

In forming the solutions in which the compounds are formed, the preferred order of addition of the reagents thereto is the following:

(1) the glycine and water are admixed to form Solution A,
(2) Solution A and the H$_2$SO$_4$ are admixed to form TGS,
(3) H$_3$PO$_4$ or H$_3$AsO$_4$ are added to form TGSP or TGSAs, respectively, and
(4) the alanine is added to the (3) TGSP or TGSAs to form the ATGSP or ATGSAs, respectively.

Water is added in order to balance the pH of the solution in the desired pH range.

Single domain seed crystals are used to initiate the growth of the ATGSP and ATGSAs crystals of the present invention from a saturated aqueous solution of ATGSP, or ATGSAs, respectively, by a slow, cooling method in the temperature range of from about 42° C. to about 35° C. for the growth of the ATGSP crystals, and in the same temperature range for the growth of the ATGSAs crystals. The growth period requires about 7 to 14 days. The seed crystals used are ATGS or ATGSP seed crystals for the desired ATGSP crystals, and ATGS or ATGSAs seed crystals for the desired ATGSAs crystals. The cooling rates and crystal growth conditions are similar to those disclosed for making single domain TGS crystals by B. Brezina in Materials Research Bulletin, Volume 6, page 401, 1971 and by K. L. Bye et al. in Ferroelectrics, Volume 7, page 179, 1974.

When making the ATGSP crystals from ATGSP solutions having a high H$_3$PO$_4$/H$_2$SO$_4$ mol ratio, of the order of about >1.0, the ATGSP crystal growth slows markedly after about 2 to 3 days. But at mol ratios of 0.05 to 1.0 relatively large optically clear single ATGSP crystals are readily obtained in a period of about 7 to 14 days.

Similarly, when making the ATGSAs crystals from ATGSAs solutions having a high $H_3AsO_4/H_2SO_4$ mol ratio, of the order of >1, the ATGSAs crystal growth slows markedly after about 2 to 3 days. But at a mol ratio of 0.05 to 1.0 relatively large optically clear single ATGSAs crystals are readily obtained in a period of about 7 to 14 days.

The reproducibility of the crystals by the above described process was excellent. Both the ATGSP and the ATGSAs crystals had shapes different from that of TGS crystals in that the (010) faces of the crystals were very well developed and thus the cutting of (010) plates therefrom, normal to the ferroelectric b axis of the crystal, i.e., parallel to these faces, can be readily and economically accomplished.

Both the ATGSP and the ATGSAs crystals could be grown so as to provide crystals of the following, relatively large, dimensions:

up to 2"×1" in area on the (010) face, and ≃1" in thickness perpendicular to the (010) face.

In order to obtain uniform doping and substitution results in preparing the crystals, the crystals are preferably grown in a container of such a size that the ratio of ½ the diameter of the face of the crystal: ½ the diameter of the container is in the range of about 1:4. Larger crystals can be grown in larger containers.

Atomic absorption analysis of the crystals shows that the amount of the $H_3PO_4$ or $H_3AsO_4$ dopant incorporated into the crystal is much below the mole fraction of the dopant in the solution in which the complexes are formed. However, even at these low levels of incorporation there were significant changes in the lattice parameters of the resulting crystals, as compared to the same parameters for the TGS crystals. Table I, in this regard, below, summarizes lattice parameter and other data from three $H_3PO_4/H_2SO_4$ concentration systems that were used in making ATGSP crystals as compared to corresponding data for a TGS crystal. ATGSAs crystals of the present invention have similar crystal lattice structures.

TABLE I

| | Amount of $H_3PO_4/H_2SO_4$ | | Lattice Parameters of Crystal | | | |
|---|---|---|---|---|---|---|
| Sample | in complex forming solution[1] | in resulting crystal[2] | a face | b face | c face | β angle |
| TGS | 0 | 0 | 9.419 | 12.65 | 5.732 | 110.36 |
| ATGSP | 0.2 | 0.53% | 9.396 | 12.62 | 5.723 | 110.4 |
| ATGSP | 0.5 | 2.9% | 9.436 | 12.58 | 5.739 | 110.7 |
| ATGSP | 1 | 12.2% | 9.547 | 12.50 | 5.745 | 113.6 |

[1]mol ratio
[2]% of mol ratio
[3]the a, b, c, face units are in Angstrom Units
[4]the β angle unit is in degrees It can be seen from the data of Table I, therefore, that with respect to the ATGSP crystals of the present invention, that up to a phosphate substitution ratio of 0.122 in the crystal, the lattice parameter c and monoclinic angle β increase with phosphorous content while the b spacing decreases. At high phosphorous concentrations, i.e. $H_3PO_4/H_2SO_4$, of greater than 1.2, the structure seems to change from monoclinic C2 and ferroelectric behavior is lost.

It is also to be noted that with respect to the ATGSAs crystals of the present invention, that up to an arsenic substitution ratio of 1.0 in the crystal, the ATGSAs crystals remain ferroelectric whereas with higher concentrations of arsenic, the ferroelectric properties are either diminished or are lost completely.

Although it is not surprising that low levels of $H_3PO_4$ and $H_3AsO_4$ can be incorporated into TGS crystals, in view of the ionic radii of the elements involved, and in other elements used in TGS dopings and/or substitutions, what is surprising is the rather major beneficial effect that such low levels of dopings with $H_3PO_4$ and $H_3AsO_4$ can have on the ATGS crystals doped therewith relative to the bulk polarization and pyroelectric coefficients of the resulting crystals, in view of the relatively poor effect that other, prior art, dopants have had on such properties in ATGS crystals doped therewith.

As compared to the prior art single crystal pyroelectrics, the crystals of the present invention have, at comparable levels of dopants and/or substituants, the following pyroelectric properties at an operating temperature of 25° C.:

TABLE II

| single crystal material | K | p μC/m² °K. | $P_s$ μC/cm² | $T_c$ (°C.) | p/K × $10^{-5}$C/ m² °K. |
|---|---|---|---|---|---|
| Prior Art | | | | | |
| TGS/ ATGS | 30–40 | 330 | 3.0 | 49 | 1.1 |
| DTGS | 19 | 270 | | 62 | 1.4 |
| TGFB | 14–16 | 210–240 | | 73 | 1.5 |
| DTGFB | 11–14 | 190–240 | 4.3 | 75 | 1.7 |
| LTGS | 40 | 400 | 3.7 | 49 | 1.0 |
| MTGS | 40 | 560 | 4.6 | 49 | 1.2 |
| Present Invention | | | | | |
| ATGSP | 30–32 | 650 | 5.0 | 51 | 2.0 |
| ATGSAs | 32 | 700 | 6.0 | 51 | 2.1–2.3 | cm = centimeter
$P_s$ = spontaneous polarization

Of all of these crystal materials only the ATGS, ATGSP and ATGSAs crystals show no significant thermal depolarization, even in the absence of a prepoling treatment.

The ATGSP and ATGSAs crystal boules that were prepared according to the present invention had dimensions of the order of 1 inch in thickness and surface areas (010) of 2 inches×2 inches. For use in a pyroelectric device, to demonstrate the pyroelectric properties of these crystals, parallel (010) plates, 0.5 mm to 1 mm (mm=Millimeters) thick, were cut from the single crystal boules, with the major surfaces thereof normal to the ferroelectric b axis. Fine surface finished (polished) samples were etched (3 minutes in a 10% $NH_4OH$ solution) and observed under an optical microscope. The plates were inclusion-free and did not show the presence of a 180 degree domain. Gold electrodes, about 5 mm in diameter, were then sputtered very carefully on these plates, so as to protect the samples from overheating during the sputtering operation.

Pyroelectric and dielectric measurements were then made on the thus prepared plate samples, which were not given any prior electric field or heat treatments, in the temperature range of between −30° and +70° C. Pyroelectric coefficients were measured by the Byer-Roundy technique (Ferroelectrics, Volume 3, page 333, 1972), and the dielectric measurements were made using a computerized automatic measuring system. The temperature dependence of the dielectric constant and the loss tangent were measured by a multifrequency LCR meter, HP (Hewlett-Packard Co.) 4274A, and Hewlett- Packard 4275A in the frequency range of $10^2$–$10^6$ Hz, at a weak AC field lower than 20 V/cm (cm=centimeter) with a basic accuracy of 0.1%. The temperature dependence of the pyroelectric coefficient and spontaneous polarization were measured with the Hewlett Packard 4140B picoampere meter. A Hewlett-Packard 9825A desktop computer was used for on-line control of automatic measurement through a Hewlett-Packard 6904B multiprogrammer interface employing software programs developed therefor. Linear temperature change in the sample temperatures with specified rates of temperature change (1° to 8° C./minute) were easily achieved. The reproducibility of the measurements was excellent.

Figure 2:
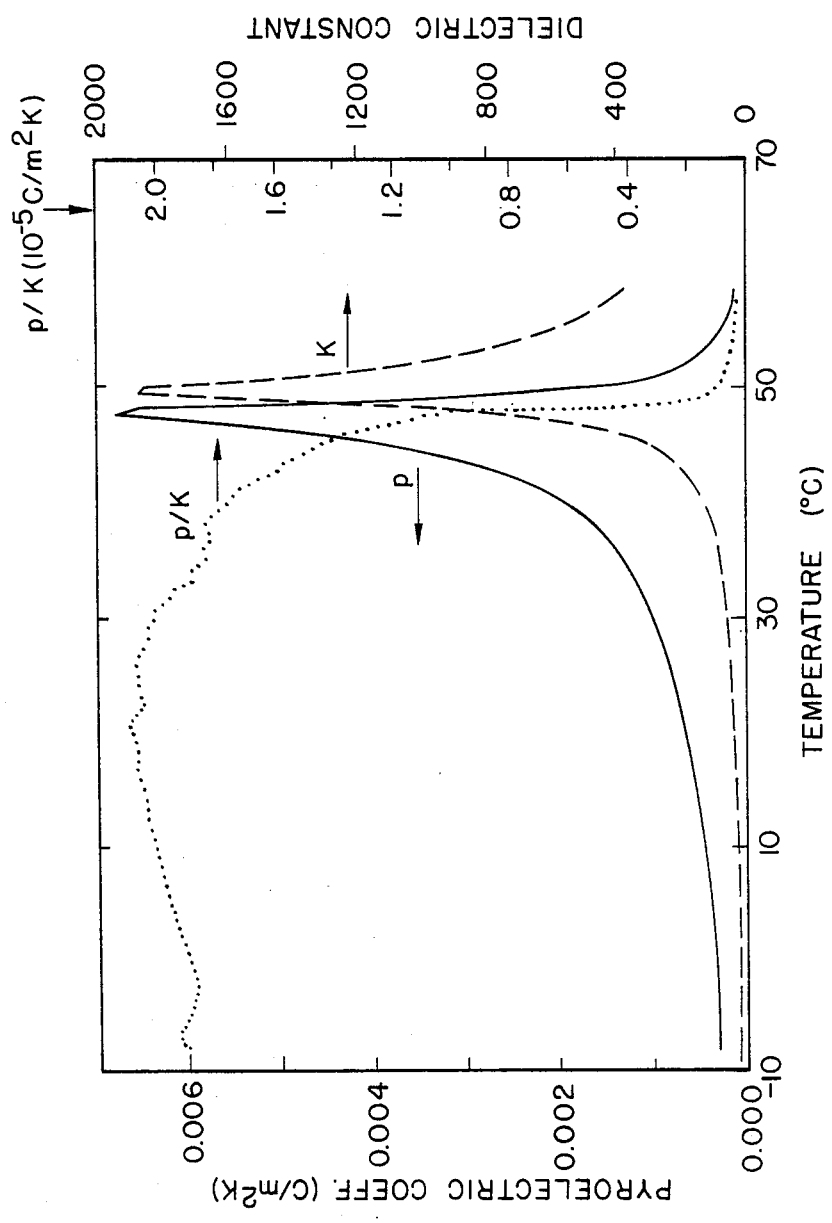
FIG. 2 of the drawings plots the pyroelectric coefficient p, the dielectric constant K and the figure of merit p/K, as a function of temperature in the range of −10 to +70° C. of preferred ATGSAs crystals of the present invention.

FIG. 1 shows the temperature dependence of the pyroelectric coefficient and the spontaneous polarization of preferred ATGSAs single crystals of the present invention. Both the pyroelectric coefficient $p=700$ $\mu C/m^2°K$ and the spontaneous polarization $P_s=6$ $\mu C/cm^2$ at room temperature are by a factor of 2 larger compared to the corresponding values on the TGS single crystals. FIG. 2 shows the temperature dependence of the dielectric constant of ATGSAs. The dielectric constant $K=30$ at room temperature is of the same value as measured on a TGS single crystal. Thus, the material figure of merit $p/K$ is more than two times larger compared to that of TGS, at room temperature. $p/K$ values at various temperatures are also shown in FIG. 2. $p/K$ vs T values practically stay constant and large over a useful temperature range. Since the dielectric constants in the case of TGS and ATGSAs are the same, the point detector figure of merit, $p\sqrt{K}$, for ATGSAs crystals also increases by a factor more than 2. Also, the observed tan $\delta$ in the arsenic-doped TGS crystals is $<10^{-2}$, so that the total increase in the detector sensitivity will be well over a factor of 2. It should be noted in this regard that the figure of merit for a point detector is determined by the ratio of $p\sqrt{K}$ tan $\delta$, whereas the figure of merit for large area pyroelectric devices, such as vidicon, is determined by the ratio of $p/K$.

Since the repeated heating and cooling cycles (from temperatures of from $-30°$ C. to $+70°$ C., above Tc) gave the same values of p and P, it appears that alanine stabilizes the polarization in ATGSAs as it does in TGS. Also, the $T_c$ of the modified TGS crystals is about the same (51° C.) as in the pure TGS (49° C.) which indicates, based on the data available to date, that no major structural change occurred due to As doping.

Pyroelectric properties of some important single crystal members of the TGS family are listed in Table II above. Clearly the As-doped TGS crystals have the best pyroelectric properties at the most desirable operating temperature $\simeq 25°$ C. ATGSAs, and ATGSP, crystals of the present invention are much less expensive to produce compared to the costlier, though the best prior art crystals, DTGFB single crystals.

Figure 3A:
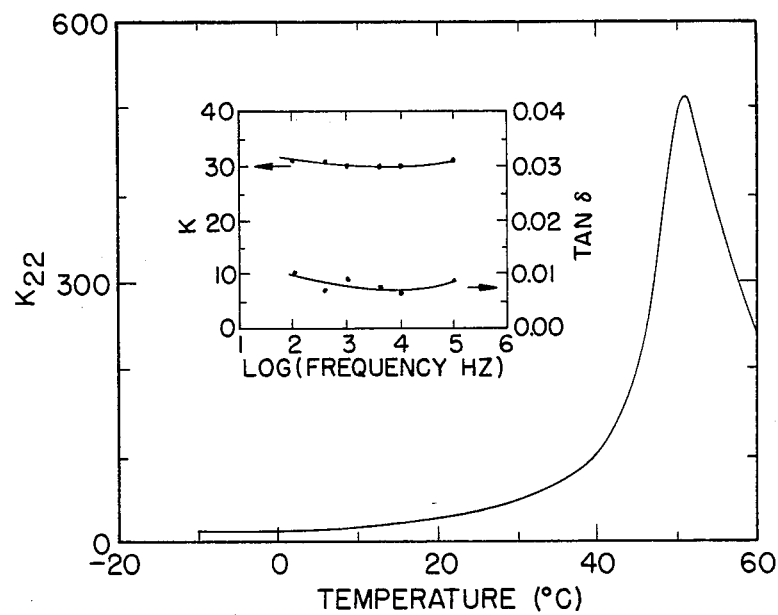
FIGS. 3A and 3B of the drawings plot the temperature (in the range of about −10 to +60° C.) and the frequency (in the range of about $10^2$ to $10^5$ Hz) dependence of the dielectric constant ($K_{22}$) and the loss tangent (Tan δ), respectively, of preferred ATGSP crystals of the present invention, i.e., wherein about 30 to 40% of the sulfate in the ATGS crystal is substituted with phosphorous.
Figure 3B:
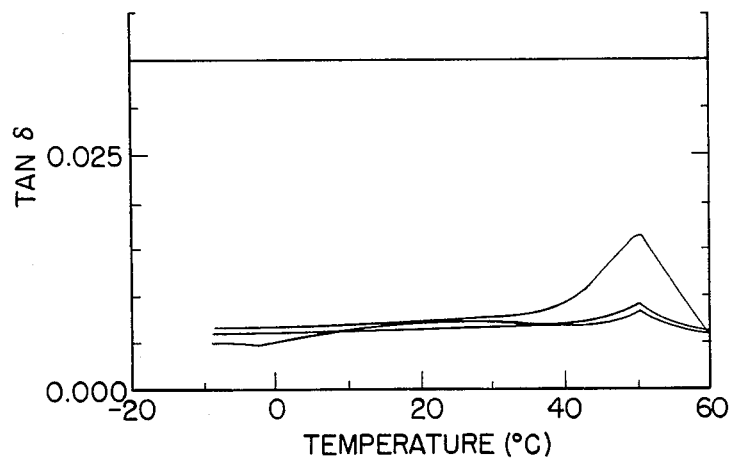

FIG. 3A shows the temperature dependence of the dielectric constant $K_{22}$, and FIG. 3B shows the temperature dependence of the loss tangent, of preferred ATGSP crystal of the present invention. The Curie temperature of ATGSP is 51° C. Because of the chemical bias effect of the alanine group, no significant depolarization can be observed. The dielectric constant at room temperature is about 30, which is lower than that of a well polarized TGS crystal. The frequency dependence of the dielectric constant at room temperature in the wide frequency range of $10^2$–$10^5$ Hz is negligible.

The loss tangent of the ATGSP crystals at room temperature is lower than $1.10^{-2}$ in the same frequency range, which is comparable with the best prior art TGS crystals, ($\sim 10^{-2}$). In FIG. 3B, the top most curve is a plot at a frequency of 10 kHz, the middle curve is a plot at a frequency of 1 kHz and the lowest curve is a plot at a frequency of 100 Hz.

Figure 4:
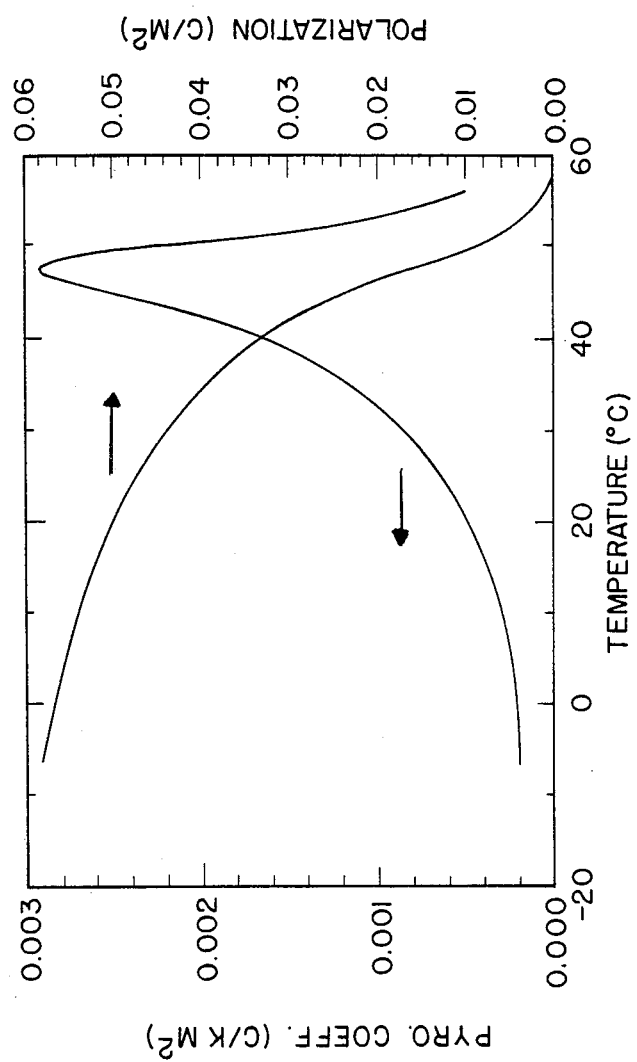
FIG. 4 of the drawings plots the temperature dependence (within the temperature range of about −10 to +60° C.) of the pyroelectric coefficient (p) and the spontaneous polarization (Ps) of preferred ATGSP crystals of the present invention.

The pyroelectric response of the ATGSP crystal is thus improved significantly by the partial substitution of phosphate for the sulfate group in TGS. FIG. 4 shows the temperature dependence of spontaneous polarization and pyroelectric coefficient of the ATGSP crystal. Because of the chemical bias effect, the ATGSP crystal is permanently poled below the Curie temperature. Therefore, no prepoling is needed. At room temperature, the spontaneous polarization of ATGSP is about $5\times 10^{-2}$ C/m$^2$, which is higher than $2.8\times 10^{-2}$C/m$^2$ of TGS. The pyroelectric coefficient of ATGSP at room temperature is about $6-7\times 10^{-4}$ C/m$^2°K$., which is more than twice that of TGS's ($2-3.5\times 10^{-4}$ C/m$^2°K$.).

What is claimed is:

1. A pyroelectric crystal having a $p/K$ value of $\geq 1.8$.
2. A pyroelectric crystal having a $p/K$ value of $\geq 2.0$.
3. A triglycine sulfate based pyroelectric crystal having a $p/K$ value of $\geq 1.8$.
4. A triglycine sulfate based pyroelectric crystal having a $p/K$ value of $\geq 2.0$.
5. An alanine doped triglycine sulfate based pyroelectric crystal having a $p/K$ value of $\geq 1.8$.
6. A crystal as in claim 1 doped with arsenic and alanine.
7. A crystal as in claim 6 having a $p/K$ value of at least 2.0.
8. A crystal as in claim 1 doped with phosphorous and alanine.
9. A triglycine based pyroelectric crystal doped with alanine and one or both of arsenic and phosphorous in compound form and having a $p/K$ value of $\geq 1.8$.
10. A triglycine sulfate based pyroelectric crystal doped with alanine and a compound of an element of Group VA of the periodic table having an atomic number of at least 15 and having a $p/K$ value of $\geq 1.8$.
11. A (010) plate cut from a (010) face of a crystal of claim 3.
12. In a pyroelectric device employing a pyroelectric crystal element, the improvement comprising employing as said element a (010) plate cut from a (010) face of a triglycine sulfate based pyroelectric crystal having a $p/K$ value of $\geq 1.8$.
13. A crystal having a composition selected from the group consisting of

and

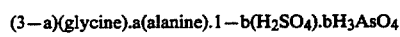

wherein
x is about 0.05 to 0.3,
y is about 0.05 to 0.5,
a is about 0.05 to 0.3, and
b is about 0.05 to 0.5.

14. A pyroelectric crystal as in claim 13 having a $p/K$ value of at least 1.8.
15. A pyroelectric crystal as in claim 14 having a $p/K$ value of at least 2.0.

16. A pyroelectric crystal as in claim 15 having a p/K value of at least 2.1 to 2.3.

17. A pyroelectric crystal as in claim 15 having the composition $$(3-x)(glycine).x(alanine).(1-y)(H_2SO_4).yH_3PO_4$$

wherein
 x is about 0.15 to 0.20 and
 y is about 0.30 to 0.40.

18. A pyroelectric crystal as in claim 16 having the composition $$(3-a)(glycine).a(alanine).(1-b)(H_2SO_4).bH_3AsO_4,$$

wherein
 a is about 0.15 to 0.20 and
 b is about 0.30 to 0.35.

* * * * *

UNITED STATES PATENT AND TRADEMARK OFFICE
CERTIFICATE OF CORRECTION

PATENT NO. : 4,648,991

DATED : March 10, 1987

INVENTOR(S) : Chang-Shui Fang, et al.

It is certified that error appears in the above-identified patent and that said Letters Patent is hereby corrected as shown below:

IN THE SPECIFICATION

Column 3, line 56, the structure should read
--(glycine)$_{3-x}$(L-$\alpha$-alanine)·xH$_2$SO$_4$--.

Column 4, line 30, "1401" should read --401--.

Column 6, line 17, "substituants" should read --substituents--.

Column 7, line 32 "p$\sqrt{K}$" should read --p/$\sqrt{K}$--.

Column 7, line 38 "p$\sqrt{K}$ tan $\delta$" should read --p/$\sqrt{K}$ tan $\delta$ --.

UNITED STATES PATENT AND TRADEMARK OFFICE
CERTIFICATE OF CORRECTION

PATENT NO. : 4,648,991

DATED : March 10, 1987

INVENTOR(S) : Chang-Shui Fang, et al.

It is certified that error appears in the above-identified patent and that said Letters Patent is hereby corrected as shown below:

Column 8, line 2, "$1.10^{-2}$" should read --$1.0 \times 10^{-2}$--.

Signed and Sealed this

Seventeenth Day of November, 1987

Attest:

DONALD J. QUIGG

Attesting Officer

Commissioner of Patents and Trademarks